US009843856B2

(12) United States Patent
Debail

(10) Patent No.: US 9,843,856 B2
(45) Date of Patent: Dec. 12, 2017

(54) ACOUSTIC SET COMPRISING A SPEAKER WITH CONTROLLED AND VARIABLE DIRECTIVITY

(71) Applicant: CABASSE SA, Plouzane (FR)

(72) Inventor: Bernard Debail, Locmaria Plouzane (FR)

(73) Assignee: CABASSE SA, Plouzane (FR)

( * ) Notice: Subject to any disclaimer, the term of this patent is extended or adjusted under 35 U.S.C. 154(b) by 424 days.

(21) Appl. No.: 14/354,856

(22) PCT Filed: Oct. 25, 2012

(86) PCT No.: PCT/EP2012/071116
§ 371 (c)(1),
(2) Date: Apr. 28, 2014

(87) PCT Pub. No.: WO2013/060761
PCT Pub. Date: May 2, 2013

(65) Prior Publication Data

US 2014/0307895 A1 Oct. 16, 2014

(30) Foreign Application Priority Data

Oct. 27, 2011 (FR) ..................................... 11 59774

(51) Int. Cl.
*H03G 5/00* (2006.01)
*H04R 1/20* (2006.01)
(Continued)

(52) U.S. Cl.
CPC ................. *H04R 1/20* (2013.01); *H04R 3/04* (2013.01); *H04R 3/12* (2013.01); *H04R 2430/20* (2013.01)

(58) Field of Classification Search
None
See application file for complete search history.

(56) References Cited

U.S. PATENT DOCUMENTS 4,472,834 A 9/1984 Yamamuro et al.
2007/0165878 A1* 7/2007 Konagai ................ H04R 1/403 381/89
(Continued)

FOREIGN PATENT DOCUMENTS

FR 2901448 A1 11/2007
FR 2965685 A1 4/2012

OTHER PUBLICATIONS

International Preliminary Report on Patentability and English translation of the Written Opinion dated Apr. 29, 2014, for corresponding International Application No. PCT/EP2012/071116, filed on Oct. 25, 2012.

(Continued)

*Primary Examiner* — Joseph Saunders, Jr.
*Assistant Examiner* — James Mooney
(74) *Attorney, Agent, or Firm* — David D. Brush; Westman, Champlin & Koehler, P.A.

(57) ABSTRACT

An acoustic chamber includes a loudspeaker, which includes at least two membranes that each reproduce a different frequency band, and a filter that makes it possible to generate a plurality of activation signals from an audio signal source. The activation signals are each applied to an actuator of one of the membranes. The acoustic chamber has an operating range having a variable and controlled directivity, each frequency of which belongs to at least two frequency bands reproduced by the membranes. The acoustic chamber obtains a directivity control signal, and the filter makes it possible to dose, for each frequency of the operating range and depending on the directivity control signal, the contribution of each one of the at least two membranes reproducing the frequency.

14 Claims, 11 Drawing Sheets

(51) Int. Cl.
*H04R 3/12* (2006.01)
*H04R 3/04* (2006.01)

(56) References Cited

U.S. PATENT DOCUMENTS

| | | | | |
|---|---|---|---|---|
| 2007/0253575 A1* | 11/2007 | Melanson | H04R 3/12 381/97 |
| 2009/0154736 A1* | 6/2009 | Lee | H04R 1/323 381/300 |
| 2010/0310080 A1* | 12/2010 | Fukuyama | H04R 3/12 381/17 |
| 2011/0222694 A1* | 9/2011 | Del Galdo | H04S 3/02 381/17 |

OTHER PUBLICATIONS

Debail et al., “An optimized full-bandwith 20Hz-20kHz digitally controlled co-axial source”, Audio Engineering Society Convention Paper 6884, Oct. 5-8, 2006, San Francisco, CA, USA, XP040507807.

Shaiek, “Optimisation des performances d’enceintes co-axiales large bande par traitement numerique du signal”, Institut Mines-Telecom-Telecom Bretagne-UEB, Jul. 2, 2007, XP55030107.

Shaiek et al., “Enhanced control of sound field radiated by co-axial loudspeaker systems using digital signal processing techniques”, Audio Engineering Society Convention Paper 6723, May 1, 2006, Paris, France, XP040507617.

International Search Report dated Nov. 26, 2012 for corresponding International Application No. PCT/EP2012/071116, filed on Oct. 25, 2012.

* cited by examiner

ACOUSTIC SET COMPRISING A SPEAKER WITH CONTROLLED AND VARIABLE DIRECTIVITY

1. CROSS-REFERENCE TO RELATED APPLICATIONS

This Application is a Section 371 National Stage Application of International Application No. PCT/EP2012/071116, filed Oct. 25, 2012, which is incorporated by reference in its entirety and published as WO 2013/060761 on May 2, 2013, not in English.

2. FIELD OF THE INVENTION

The field of the invention is that of speakers implementing coaxial technologies (also called coaxial speakers) and acoustic sets comprising such coaxial speakers (also called coaxial multiway acoustic sets or loudspeaker systems).

More specifically, the invention pertains to a technique for controlling the directivity of such coaxial multiway acoustic sets and for making it variable.

Directivity is an important parameter for characterizing the radiation of an acoustic source. The directivity measures the angular dispersion of its radiation from a speaker. It is known that, to have good sound in a room, the directivity of the system of speakers must increase constantly and homogenously (without abrupt changes) across the entire range of frequencies. Depending on the use desired, this parameter must be optimized: the source must for example have a highly directive radiation pattern in the case of a sound system in a reverberating environment or, on the contrary it must be highly open for rear acoustic set applications in home cinema.

The control of directivity corresponds to a major need which is unfortunately difficult to master.

To quantify the directivity of an acoustic set, it is generally its directivity index that is used. This directivity index presents the development, as a function of the logarithm of the frequency, of the ratio between the acoustic pressure radiated by the acoustic set in its main axis and the acoustic pressure radiated by a simple source (a monopole source) placed at the center of this acoustic set and having the same power. The directivity index indicates a level of dB greater than or lower than that radiated by a spherical sound source. Zero dB describes an omnidirectional acoustic set, broadcasting sound in the same way in all directions.

3. TECHNOLOGICAL BACKGROUND 3.1 Predefined and Non-Variable Sources of Directivity 3.2.1 Particular Case of a Coaxial Multiway Acoustic Source For many decades now acoustics specialists have paid special attention to making acoustic sets that are closest to the theoretical ideal essentially characterized by:

1. A faithful rendering of the entire audible frequency band ranging from 20 Hz to 20 kHz. This characteristic corresponds to a axial flat amplitude and linear phase response throughout the audible frequency band.
2. A low rate of non-linear distortion.
3. The absence of diffraction problems related to any kind of geometrical disposition of the speakers constituting the source. These effects can furthermore come from a discontinuity at the edges of the acoustic set.
4. A homogenous and well-controlled directivity especially at the level of the overlap frequency bands between the different speakers of the acoustic system.

In practice, the verification of all the above criteria comes up against problems of very high technological complexity. Indeed, the first two requirements can be met by the association of several speakers dedicated to the rendering of complementary frequency sub-bands. However, the last two points, including the one related to directivity, are related to the geometry of the acoustic set or to the spatial disposition of the different speakers constituting it. Indeed, since there is no speaker capable of reproducing the totality of the audio signal (20 Hz to 20 kHz), a traditional acoustic set is generally constituted by several speakers, each dedicated to one frequency sub-band or channel. Each speaker is designed to present the best performance in terms of the frequency sub-band that it reproduces. The terminology often adopted to distinguish the different transducers is the following:

- woofer: frequency band below the audio domain ($f<200$ Hz);
- low-mid speaker: sub-band below the central frequency band of the audio domain (200 Hz$<f<$800 Hz);
- high-mid speaker: sub-band above the central frequency band of the audio domain (800 Hz$<f<$4000 Hz);
- tweeter: frequency band above the audio domain ($f>4000$ Hz).

The frequencies $f_1$=200 Hz, $f_2$=800 Hz and $f_3$=4000 Hz are called cross-frequencies. They demarcate the frequency bands generally allocated to each transducer.

In the classic configuration of a multiway acoustic source, the speakers are spread out on the facade of an acoustic set. This disposition of the transducers (membranes) has a drawback in terms of radiation at the level of the overlap frequency bands, especially in the context of the near field (i.e. in the vicinity of the acoustic set), given the delays between the sound waves emitted by the different speakers and perceived by the listener. In order to overcome these drawbacks, one innovative solution consists in reducing the inter-transducer spacing by adopting a coaxial configuration in which the different speakers are mounted on a same axis (the term "coaxial speaker with several membranes" is also used). This enables a more consistent rendering of the waves coming from the different transducers, even in very near fields.

When setting up a coaxial multiway acoustic source, great importance must be given to the characteristics of directivity of this source. Indeed, these characteristics significantly influence the subjective evaluation of the source once it is placed in a room. As a consequence, the sizes and profiles of the different membranes, as well as the geometry of the acoustic set, must be chosen with great care in order to attain a predefined target directivity since it is essentially these parameters that will condition the directivity of the acoustic set in the frequency band. Indeed, the speakers used are generally acoustically adapted to one another, i.e. they are designed to work on complementary frequency bands on which the response curves show the least possible unevenness so as to prevent excessively marked differences that would imbalance the sounds emitted. Thus, for a coaxial multiway source, it is generally desired to have an index of directivity of the source with an affine linear progression as a function of the frequency with a slope of the order of 5 dB/octave.

In the overlap bands, in order to ensure the continuity of the progress of the index of directivity, digital signal processing techniques are used in practice (without this being restrictive since an analog, or even passive, filtering could also be suitable). These techniques drive the coaxial multiway source and are for example implemented in a digital signal processor. They carry out for example an axial delay compensation, a cross-over filtration and an equalization enabling an apparent improvement of the field radiated by the coaxial multiway acoustic source. The crossover filters are also called bypass filters.

In order to achieve better control over certain residual defects (fluctuations in the radiation pattern or in the index of directivity at the overlap frequency bands) due to differences between the directivities proper to the different transducers, it has been proposed to optimize the cross-over filtering at the level of these overlap frequency bands. This optimization is based on a weighting of the frequency responses of the cross-over filters making it possible to modify the differences between the amplitudes and the phases of different channels of the source.

In order to resolve this problem of optimizing the cross-over filter, an overall approach is described in detail in the following documents:

- the article (denoted [1]) "An optimized full-bandwidth 20 Hz-20 kHz digitally controlled co-axial source", 5-8 Oct. 2006, San Francisco, Audio Engineering Society, Convention Paper (Shaiek, Debail, Kerneis, Boucher and Diquelou); and
- thesis by M. Shaiek, defended on 2 Jul. 2007, "Optimisation des performances d'enceintes coaxiales large bande par traitement numérique du signal" (Optimizing wideband coaxial acoustic sets by digital signal processing").

In this overall approach, the filter synthesizing algorithm takes account, in a same cost function, of the different parameters to be optimized. This overall approach is based on an iterative digital search for complex weightings in using the gradient algorithm. The idea is to increase the cost so that in addition to the axial response and the radiation pattern, possible fluctuations of the directivity index of the source at the overlap frequency bands are minimized.

It may be recalled that the goal sought in implementing this optimizing of cross-over filtering according to the overall approach is to obtain a coaxial multiway acoustic source having an affine progression of its directivity index as a function of frequency, even at the overlap frequency bands.

This known technique (described in detail in the article and the dissertation mentioned here above) in no way seeks to obtain variable directivity. The target directivity therein is predetermined: it is fixed at the time of manufacture of the acoustic set and is therefore not adapted to the room or to the layout and to the user's preferences. This known technique does not provide for modifying the slope of the straight line representing the affine function of the directivity index nor does it vertically translate this straight line.

The overlap frequency bands between adjacent transducers (membranes) are discussed solely because the directivity index of the acoustic set undergoes undesired fluctuations (defects) in these overlap bands because of differences between the directivities proper to the different transducers.

Furthermore, these overlap frequency bands are of small widths compared with the frequency bands of the different transducers (membranes), and therefore the frequency band of operation of the acoustic set.

3.2.2 Other Cases of Acoustic Sources with Predefined and Non-Variable Directivity The directivity of a speaker is created by interference between the signals generated at different points of the membrane of this speaker. To obtain a narrowing of the directivity pattern, the dimensions of the membrane need to be of the order of the wavelength of the signal sent (i.e. the sound signal generated by the membrane). This makes it necessary to have wide-diameter membranes at the bottom of the spectrum.

In stereo listening, the acoustic sets have a directivity pattern that is fixed at the time of their design. In a reverberating environment, one solution for diminishing the relative importance of the reverberation is to bring the acoustic sets closer to the listening position (in order to favor the direct wave/reflected wave ratio). But bringing the distance between the acoustic set and the listener into play amounts to setting constraints for the user. These are constraints which the user generally cannot apply except by modifying the furnishing and configuration of the listening room. In a reverberating environment, another solution to diminish the relative size of the reverberation consists in laying out absorbent elements in the room (in order to reduce the reverberation). However such a mode of processing the acoustics of the room is not simple to implement and is not necessarily possible. In a highly sound-dampened environment, the only parameter of adjustment that can be used to try and obtain a desired direct wave/reflected wave ratio remains the orientation of the axes of these acoustic sets; This can be done so as to favor reflections if any in order to bring early reflections towards the listener.

In multichannel listening, the rear acoustic sets can be dipolar. This technique consists in making two speakers work back to front, in phase opposition, so as to present a figure-of-eight type of directivity in order to create diffused sound without direct wave scattering. However, di-polar acoustic sets do not enable the direct wave/reflected wave ratio to be modulated.

In multichannel listening, another solution to obtain a desired pattern of directivity is to use an acoustic set comprising two identical speakers placed one behind the other and to create a phase shift between these two speakers (by applying a delay to one of the two speakers). This old principle, known as the "gradient speaker" principle is limited to the field of the low frequencies since, for higher frequencies, the directivity is further dictated by the phenomena of diffraction of the acoustic set and by the intrinsic directivity of the speakers. Furthermore, with this principle, the directional effect is obtained solely by an effect of cancellation of phase of one speaker relative to the other. This entails high penalties in terms of acoustic efficiency. This principle makes it possible to approach only first-order directivities. Now, it is sometimes desired to obtain far more complex directivities.

3.2 Source with Variable Directivity

To generate a pattern of variable directivity, there are known solutions based on networks of speakers, filtered for example by means of a DSP. In this way, an "acoustic antenna" is constituted and the amplitude and the phase of each of the speakers (the speakers are all identical) is used. The directivity of the acoustic antenna is generated by means of a signal processing by controlling the signals sent to each of the speakers. The directivity in no way results from the intrinsic directivity of the membranes of the network of speakers forming the antenna since all the speakers (and therefore all the membranes) are identical but rather from their spatial positions which are different. Besides, the directivity can become variable only if the dimensions of the acoustic antenna are of the order of magnitude of the length of the wave to be reproduced. Super-directive algorithms exist but they entail penalties in terms of sensitivity and robustness of performance (the intrinsic disparities of the speakers will lead to an accentuated disparity of performance of the acoustic antenna, especially in terms of pattern of directivity).

One drawback of these solutions is that they make it necessary to have rear distance so that the acoustic set can work in a field known as a far field. For example, a network of speakers with a width of 4 cm works in fat field conditions at 6300 Hz when the listener is at more than 3 m.

Another drawback of these approaches is that it offers only the possibility of configuring the acoustic antenna (i.e. synthesizing a given directivity) at a given point in time but is not designed for dynamic modification (no directivity control signal) by the user or automatically.

Another drawback of these approaches is that they offer control of directivity only on one plane (in general the horizontal plane). Matrices of speakers are needed to enable management of directivity on another plane (the vertical plane for example), but the other planes passing through the axis of the system are more or less well controlled and necessarily different.

Yet another drawback of these approaches is that the range of frequencies of operation is limited since all the speakers of the network are identical and therefore must cover a wide frequency band. This is difficult or even impossible to obtain. In practice, the reproduced frequency band is therefore limited.

4. SUMMARY OF THE INVENTION

One particular embodiment of the invention proposes an acoustic set comprising: a coaxial speaker comprising at least two coaxial membranes each reproducing a different frequency band; and means for filtering enabling the generation, from a source audio signal, of a plurality of activation signals each supplying a means for actuating one of the membranes. The acoustic set possesses a range of operation with variable and controlled directivity, each frequency of which belongs to at least two of the frequency bands reproduced by the membranes. It comprises means for obtaining a directivity control signal. The means for filtering can be used, for each frequency of said range of operation, to apportion the contribution of each of the at least two membranes reproducing said frequency according to the directivity control signal.

The proposed approach therefore consists in making a coaxial multiway acoustic set (i.e. an acoustic set comprising a coaxial speaker) with variable directivity. The idea consists in very widely extending the spectrum of reproduction of each membrane constituting the coaxial speaker so as to obtain one or more very extensive and conjoined ranges of overlap (each frequency can be reproduced by at least two membranes). The means for filtering enable the precise apportioning of the contributions of each of the membranes at each frequency. Because the membranes have different levels of directivity, the directivity of the acoustic set is variable, at each frequency, depending on the set of contributions chosen for the membranes producing this frequency. In other words, the directivity of the acoustic set results firstly from the intrinsic directivity of the membranes of the coaxial speaker (the directivity of the acoustic set is controlled by apportioning the contributions of the membranes with respect to one another).

This approach is wholly novel and inventive since, in the prior art, the overlap regions of a coaxial speaker are very limited and the means for filtering are not used to obtain variable directivity but to ensure a predetermined target directivity (affine evolution of the directivity index according to the frequency) only at the level of the overlap frequency bands.

In the proposed solution, the directivity is variable and controlled by the directivity control signal. Thus, on a wide spectrum, the sound beam generated by the coaxial speaker depends on the value of the directivity control signal (the width of this sound beam can vary between a very narrow value and a very wide value). In the prior art, the acoustic set receives a source audio signal but there is no such additional directivity control signal.

Finally, the symmetry of revolution of the coaxial speaker enables the generation of a directivity that is variable simultaneously in all the planes passing through the axis of the speaker. This is obtained only by means of a directivity control signal. The directivity obtained is identical on all the planes.

According to one particular characteristic, the coaxial speaker comprises at least three coaxial membranes each reproducing a different frequency band and said operating range is formed by at least two contiguous overlap bands between the frequency bands produced by said at least three membranes.

Thus, the width of the range of operation with variable and controlled directivity is increased.

According to a first implementation, the means for obtaining the directivity control signal comprise means for the setting of the value of said directivity control signal by a user.

Thus, in this first mode of implementation, the directivity control signal comes for example from an adjustment potentiometer enabling the user to easily obtain variation in the directivity of the acoustic set. In other words, the directivity is not fixed during the manufacture of the acoustic set but can be adapted to the room, the layout and the user's preferences through the means for setting (a potentiometer for example) the directivity.

According to a second mode of implementation, the means for obtaining the directivity control signal comprise:
- means for receiving a data stream containing said source audio signal and said directivity control signal; and
- means for extracting the directivity control signal contained in the data stream.

Thus, in this second implementation, the directivity control signal is conveyed at the same time as the audio signal in the form of "metadata". The directivity of the acoustic set can thus be modified dynamically, according to the effect sought by the sound engineer when creating the source audio signal (sound band of a DVD support for example).

According to one particular characteristic, the coaxial speaker comprises at least three membranes forming at least three adjacent channels belonging to the group comprising: a woofer, a low-mid channel, a high-mid channel and a tweeter.

According to one particular aspect of the invention, the acoustic set comprises equalization means placed upstream to the means for filtering and acting as a function of the directivity control signal.

Thus, the equalization performed corrects the differences in frequency balance and ensures the tonal equilibrium of the acoustic set whatever the directivity chosen.

According to one particular characteristic, the means for filtering are implemented at least partially in the form of a processor executing at least one determined filtering program.

In this way, the means for filtering are simple to make and cost little.

According to one particular characteristic, to apportion the contribution of a given membrane at a given frequency as a function of the directivity control signal, the means for filtering act on the amplitude of a sound wave generated by the given membrane at the given frequency.

In other words, to apportion the contribution of a given membrane at a given frequency as a function of the directivity control signal, the means of filtering apply, for the given membrane and the given frequency, a filtering the amplitude of which is weighted as a function of the directivity control signal Thus, in a simple implementation, the directivity control signal acts via the means for filtering solely on the amplitude of the different groups of membranes.

According to one particular characteristic, for apportioning the contribution of the given membrane at the given frequency as a function of the directivity control signal, the means for filtering furthermore act on the phase of the sound wave generated by the given membrane at the given frequency.

In other words, to apportion the contribution of the given membrane at the given frequency as a function of the directivity control signal, the means for filtering apply, for the given membrane and the given frequency, a filtering the phase of which is also weighted as a function of the directivity control signal.

In this more elaborate implementation, the directivity control signal acts via the means for filtering on the amplitude and phase of the different groups of membranes. This enables a more precise action on the directivity of the acoustic set.

According to one particular aspect of the invention, for each frequency of said range of operation, the directivity control signal is proportional to an average directivity index desired for the acoustic set at said frequency.

Thus, the invention brings into play the overall form of the directivity and not a specific direction of space. The directivity control signal can be defined by a desired average directivity index for each frequency of the range of operation.

Another embodiment of the invention proposes a signal transporting a data stream containing a source audio signal and a directivity control signal, said directivity control signal make it possible to dynamically control and vary the directivity of an acoustic set (according to any one of the embodiments here above).

As already indicated here above, in the prior art there is no directivity control signal. Even less is there a stream transportation signal transporting both a source audio signal and such a directivity control signal.

Another embodiment of the invention proposes an acoustic set in which said means for filtering comprise:

- at least two blocks each enabling the generation, from a distinct source audio signal, of a plurality of activation signals each associated with one of the membranes;
- summing means enabling the summing of the activation signals generated by said blocks, as a function of the membranes with which they are associated, to obtain resultant signals, each feeding one of said means for actuating one of the membranes;

in addition, the acoustic set comprises means for obtaining at least two directivity control signals each associated with one of the source audio signals, and each block makes it possible, for each frequency of said range of operations and as a function of the directivity control signal associated with the source audio signal received by said block, to apportion the contribution of each of said at least two membranes reproducing said frequency, for the reproduction of said source audio signal received by said block.

Another embodiment of the invention proposes a signal transporting a data stream containing at least two source audio signals each associated with a distinct directivity control signal, each directivity control signal making it possible to dynamically control and vary the directivity of an acoustic set of the above-mentioned type (receiving at least two source audio signals), for the reproduction of the source audio signal associated with said directivity control signal.

5. LIST OF FIGURES

Other features and advantages of the invention shall appear from the following description, given by way of an indicatory and non-exhaustive example, and from the appended drawings, of which:

FIG. 1A presents a block diagram of an acoustic set according to one particular embodiment of the invention;

FIG. 1B presents an example of an embodiment of the filtering stage 3 appearing in FIG. 1A;

FIG. 2 presents an example of a frequency response, in the axis of the coaxial speaker of FIG. 1A, for each of the three channels, without filtering;

FIG. 3 presents a polar response at 1250 Hz of the low-mid and high-mid channels of the coaxial loud speaker of FIG. 1A without filtering;

FIG. 4 presents a polar response at 5000 Hz of the low-mid, high-mid and tweeter channels of the coaxial speaker of FIG. 1A without filtering;

FIG. 5 presents a polar response at 10000 Hz of the high-mid and tweeter channels of the coaxial speaker of FIG. 1A without filtering;

FIG. 6 is a block diagram of an acoustic set according to a second particular embodiment of the invention;

FIG. 7 presents a polar response at 1250 Hz of a combination of low-mid and high-mid channels of the coaxial speaker of FIG. 1A obtained with particular sets of weighting values;

6. DETAILED DESCRIPTION

Figure 1A:
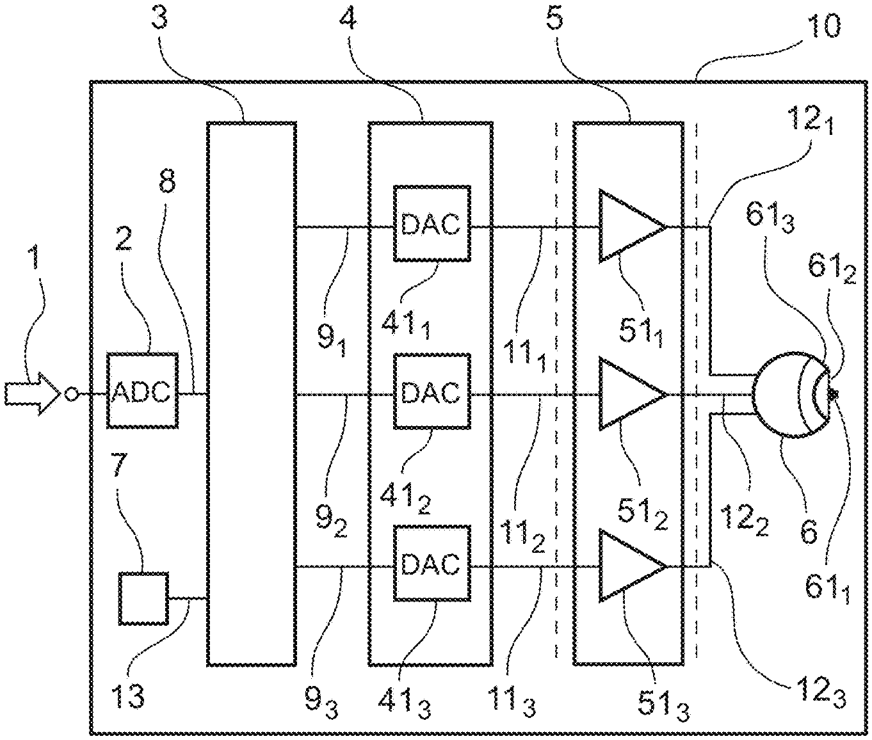

In the particular embodiment of the invention presented in FIG. 1A, it is assumed that the acoustic set 10 is a three-way acoustic set: one low-mid channel, one high-mid channel, one tweeter channel. The invention however can also be applied with two channels or more than three channels.

The acoustic set comprises:

a block 7 for obtaining a directivity control signal 13;

an analog/digital conversion stage comprising an analog/digital converter (ADC) 2, which receives a source audio signal 1, should the input signal 1 not be digital;

a filtering stage 3, which receives a signal 8 output from the analog/digital converter (ADC) 2, as well as the directivity control signal 13. It generates three signals $9_1$, $9_2$ and $9_3$, corresponding to the three above-mentioned channels. An exemplary embodiment of this filtering step 3 is described here below with reference to FIG. 1B;

a digital/analog conversion stage 4 comprising three digital/analog converters (DAC) $41_1$, $41_2$ and $41_3$, each receiving one of the signals $9_1$, $9_2$ and $9_3$ generated by the filtering stage 3;

an amplification stage 5 comprising three amplifiers $51_1$, $51_2$ and $51_3$, each receiving one of the signals $11_1$, $11_2$ and $11_3$ generated by the digital/analog conversion stage 4;

a transduction stage 6 comprising three transducers $61_1$, $61_2$ and $61_3$, each comprising a membrane and a means of electrodynamic actuation (typically a coil, magnetic circuit and basket assembly). Each transducer receives signals $12_1$, $12_2$ and $12_3$ generated by the amplification stage 5.

In one alternative embodiment, the amplification stage 5 is digital (i.e. it comprises amplifiers capable of receiving and processing the digital signals $9_1$, $9_2$ and $9_3$ generated by the filtering stage 3) and the acoustic set does not comprise the digital/analog conversion stage 4.

The transducers of the low-mid and high-mid channels comprise for example two membranes (one in each transducer) made in the form of a concentric circular rings. The transducer of the tweeter channel comprises for example a dome.

The block 7 for obtaining the directivity control signal 13 comprises for example an adjustment potentiometer enabling the user to easily vary the directivity of the acoustic set. In one variant, the directivity control signal 13 is conveyed at the same time as the source audio signal 1 (for example in the form of "metadata") and block 7 for obtaining this directivity control signal 13 comprises means for receiving a data stream (containing the source audio signal 1 and the directivity control signal 13) and means for extracting the directivity control signal 13 contained in this data stream.

Figure 1B:
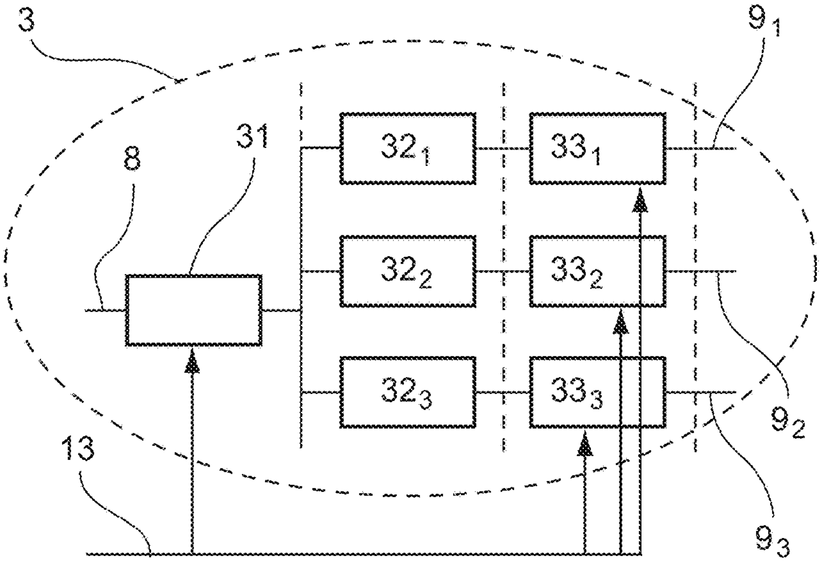

In the example of an embodiment illustrated in FIG. 1B, the filtering step 3 comprises:

an amplitude equalization stage comprising an equalizer filter 31 which receives a signal 8 output from the analog/digital converter (ADC) 2 as well as the directivity control signal 13;

a stage for putting the channels into phase (adjusting delays due to axial shifts of the membranes) comprising three delay lines $32_1$, $32_2$ and $32_3$, each receiving the output signal from the equalizing filter 31. Each of the delay lines corresponds to one of the three channels mentioned here above;

a cross-over filtration and directivity control stage comprising three filters $33_1$, $33_2$ and $33_3$, each corresponding to one of the above-mentioned three channels. Each of the filters receives the output signals from one of the delay lines $32_1$, $32_2$ and $32_3$, as well as the directivity control signal 13. The filters of the different channels are therefore a function of the bandwidth of use of each transducer but also of the directivity desired by the user.

The equalizing filter 31 corrects the differences in the balance and thus guarantees the tonal balance whatever the directivity chosen. In practice, this equalizing filter 31 can be integrated into the channel cross-over filter $33_1$, $33_2$ or $33_3$ of each of the channels. This reduces the computation load of a DSP implementing the filtering stage 3.

Figure 2:
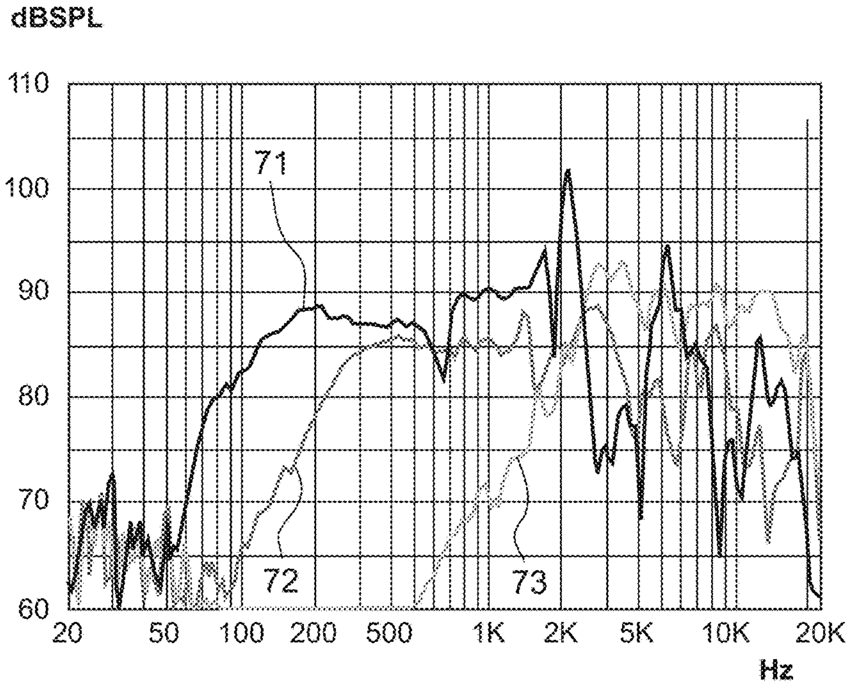

FIG. 2 shows an example of a frequency response in the axis of the coaxial speaker of FIG. 1A for each of the three channels without filtration. In this example:

the non-filtered low-mid (LM) channel covers a frequency band of about 80 Hz-8 kHz (frequency response curve referenced 71);

the non-filtered high-mid (HM) channel covers a frequency band of about 250 Hz-10 kHz (frequency response curve referenced 72); and the non-filtered tweeter (TW) channel covers a frequency band of about 2 kHz-20 kHz (frequency response curve referenced 73).

The non-filtered low-mid and high-mid channels therefore have a common bandwidth (overlap band) extending from 250 Hz to 8 kHz. In this overlap band, it is therefore possible to combine their contributions in order to modify the filtered directivity of the acoustic set.

Figure 3:
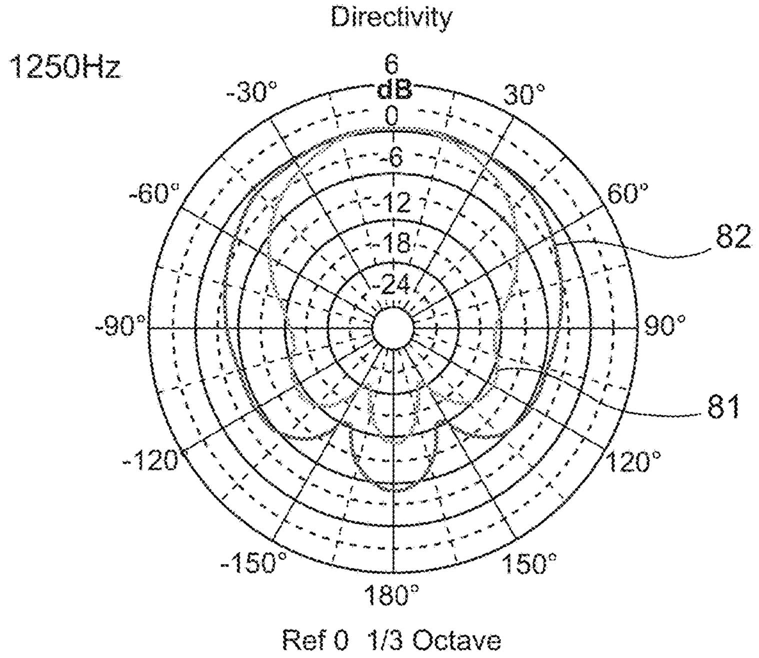

By way of an example, FIG. 3 shows the polar response (a directivity pattern) of the low-mid channels (curve referenced 81) and high-mid channels (curve referenced 82) at 1250 Hz, without filtering. As expected, it is noted that the directivity is greater for the high-mid channel comprising the smallest membrane or membranes and narrower for the low-mid channel comprising the biggest membrane or membranes.

If the user wishes to obtain the narrowest directivity (represented by the curve referenced 81) at this frequency of 1250 Hz, the filtering must be such that all the contribution of the acoustic set to this frequency is provided by the low-mid transducer and that the contribution of the high-mid transducer is zero (therefore completely filtered) at this frequency.

Conversely, if the user wishes to obtain the greatest directivity (represented by the arrow referenced 82) at this frequency of 1250 Hz, the filtering must be such that all the contribution of the acoustic set to this frequency is provided by the high-mid transducer and that the contribution of the low-mid transducer is zero (therefore completely filtered) at this frequency.

The table here below summaries the situation:

| Weighting by the low-mid filter $33_1$ | Weighting by the high-mid filter $33_2$ | Directivity obtained (after filtering) |
|---|---|---|
| 1 | 0 | Narrowest curve (referenced 81) |
| 0 | 1 | Widest curve (referenced 82) |

Naturally, between these two extreme values of directivity, the weightings can be intermediate between 0 and 1 on each of the channels so as to obtain intermediate patterns of directivity between these two extremes.

Similarly, FIG. 2 shows that the high-mid and tweeter channels have a common bandwidth (overlap band) extending from 2 kHz to 10 kHz. In this overlap band, it is therefore possible to combine their contributions in order to modify the directivity of the filtered acoustic set.

Figure 5:
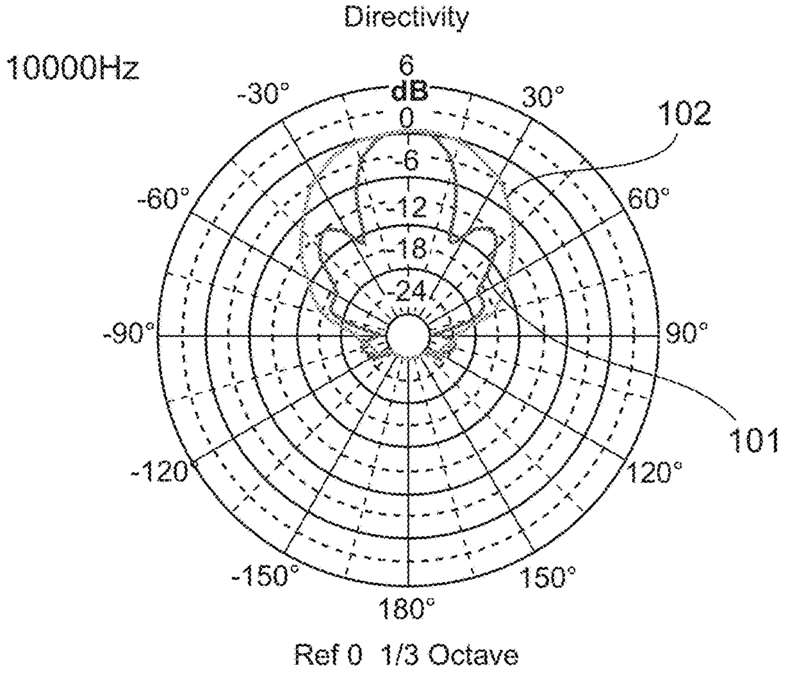

By way of an example, FIG. 5 shows the polar response (pattern of directivity) of the high-mid channels (curve referenced 101) and tweeter channel (curve referenced 102) at 10000 Hz without filtering. As expected, it is noted that the directivity is wider for the tweeter channel comprising the smallest membrane (dome) and narrowest for the high-mid channel comprising the biggest membrane.

If the user wishes to obtain the narrowest directivity (represented by the curve referenced 101) at this frequency of 10000 Hz, the filtering must be such that the entire contribution of the acoustic set at this frequency is provided by the high-mid transducer and that the contribution of the tweeter transducer is zero (hence completely filtered) at this frequency.

Conversely, if the user wishes to obtain the widest directivity (represented by the curve referenced 102) at this frequency of 10000 Hz, the filtering must be such that all the contribution of the acoustic set at this frequency is provided by the tweeter transducer and that the contribution of the high-mid transducer is zero (therefore completely filtered) at this frequency.

The table here below summarizes the situation:

| Weighting by the low-mid filter $33_1$ | Weighting by the high-mid filter $33_2$ | Directivity obtained (after filtering) |
|---|---|---|
| 1 | 0 | Narrowest curve (referenced 101) |
| 0 | 1 | Widest curve (referenced 102) |

Naturally, between these two extreme values of directivity, the weighting can be intermediate between 0 and 1 on each of the channels so as to obtain intermediate patterns of directivity between these two extremes.

Figure 4:
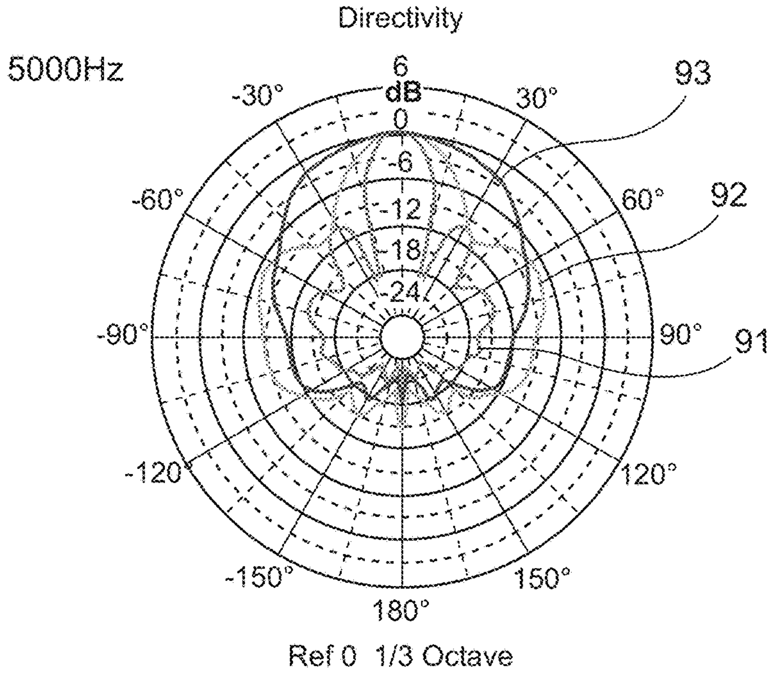

It will be noted that, in FIG. 2, the 2 kHz-8 kHz band can be covered by all three transducers (i.e. all three three channels). In this overlap band, the polar patterns of the three channels can be combined (in the same way as explained here above for two channels) in order to obtain a more extensive panel of variation of directivity. For example, FIG. 4 shows the polar response (pattern of directivity) of the low-mid channel (curve referenced 91), high-mid channel (curve referenced 92) and tweeter channel (curve referenced 93) at 5000 Hz, without filtering. As expected, it is noted that by decreasing order of width of directivity, we have the directivity of the original channel, that of the high-mid channel and finally that of the low-mid channel.

In short, in the example of FIG. 2, we have several overlap bands, namely:

- 250 Hz to 2 kHz, for the overlap band between the non-filtered low-mid and high-mid bands;
- 2 kHz to 8 kHz, for the overlap band between the non-filtered low-mid, high-mid bands and tweeter channels;
- 8 kHz to 10 kHz for the overlap band between the non-filtered high-mid bands and tweeter channels.

The solution proposed therefore enables the use of this coaxial speaker on an extended band of 250 Hz to 10 kHz for example, as a speaker whose directivity is variable and controlled (as a function of the directivity control signal 13).

Advantageously, it is preferable to choose membrane sizes with different dimensions (provided that a desired bandwidth is arrived at for each of the speakers), so as to be able to obtain patterns of directivity that are themselves very different and to therefore obtain a wider directivity adjusting panel.

In a more elaborate variant, the pattern of radiation of each transducer (each filter channel), i.e. the contribution of each transducer to a given frequency, can be modulated:

- not only by means of a weighting of the amplitude of the filter of the channel of this transducer at this frequency (weighting done by means of the gain of the filter at the frequency considered) as is the case in the above example,
- but also through a weighting of the phase of the filter of the channel of this transducer at this same frequency (weighting done by means of the phase of the filter at this same frequency).

Taking a particular example of the complex weighting of amplitude and phase according to the above-mentioned variant, it is possible to choose one of the two following sets of weighting values, each bringing into play negative coefficients −1 (amplitude 1, phase 180°):

| Weighting on the low-low-mid filter $33_1$ | Weighting on the high-high-mid filter $33_2$ | Directivity obtained (after filtering) |
|---|---|---|
| 1 | −1 | Curve 82a (FIG. 7) |
| −1 | 1 | Curve 82b (FIG. 7) |

Figure 7:
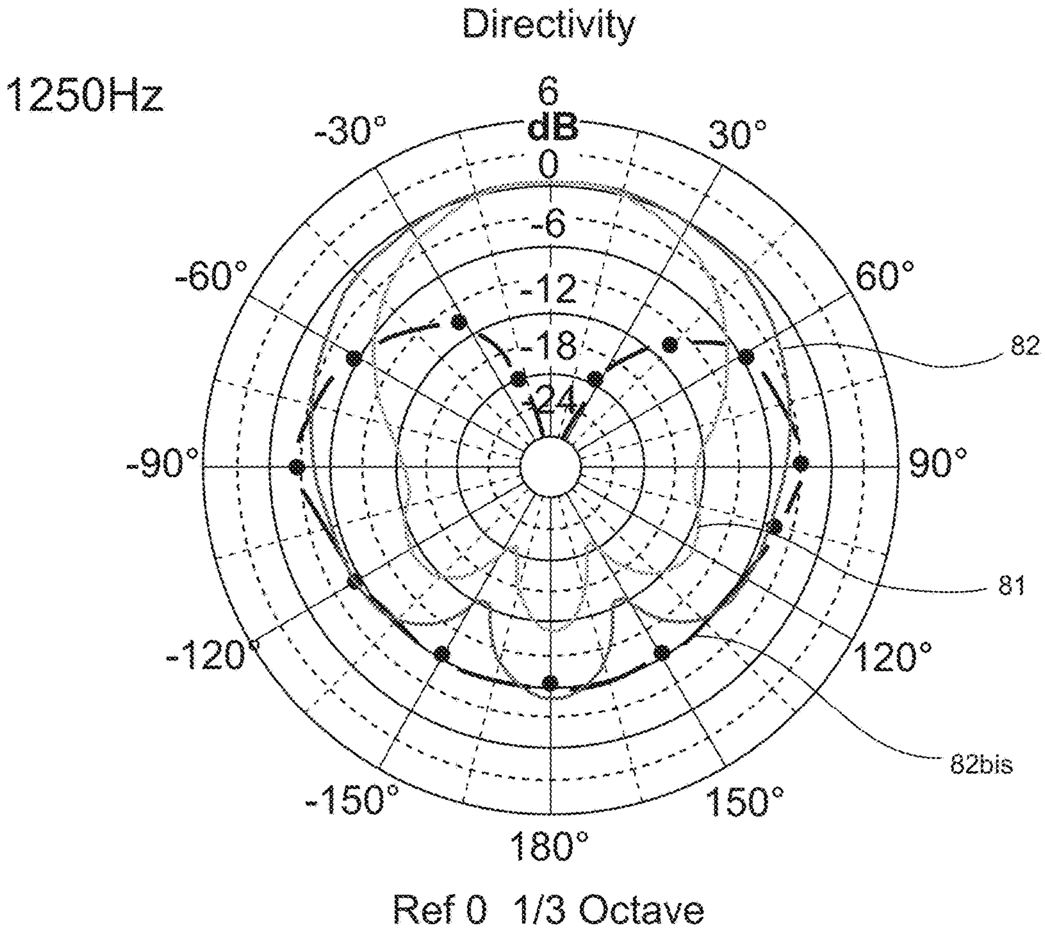

FIG. 7 gives a view, like FIG. 3, of the polar response (pattern of directivity) of the low-mid channel (curve referenced 81) and high-mid channel (curve referenced 82) at 1250 Hz without filtering. It also shows the polar response (pattern of directivity) 82*a* obtained with each of the two above-mentioned sets of weighting values. Indeed, the signal phase is inverted in one case relative to the other but the pattern of directivity is the same. It can be noted in this pattern of directivity 82*a* that the contribution in this axis is cancelled and that the maximum contributions (lobes) are +90° and −90°.

The filter synthesis giving the gain and the phase of the filters of the different channels can implement the optimal algorithm set forth in the article [1] mentioned here above. In other words, constraints are fixed (as a function of cost integrating for example the axial response, the radiation pattern and the index of directivity) and, through the algorithm used, a filtering vector is obtained specifying the amplitude and phase to be applied by each filter in each overlap band to obtain a filter fulfilling the constraints to the utmost efficiency.

The directivity control signal 13 can for example be proportional to the parameter $DI_{av}$, i.e. the mean directivity index sought (see equation (14) of the above-mentioned article).

The filtering stage 3 (see FIG. 1A) is implemented for example at least partially in the form of a DSP (or other processor) executing at least one determined filtering program.

More generally, this filtering stage 3 can be obtained equally well:

- according to a software solution, i.e. on a reprogrammable computing machine (PC computer, processor, DSP, microcontroller, etc) executing a program comprising a sequence of instructions, or
- according to a hardware solution, i.e. on a dedicated computation machine (for example an FPGA (field programmable gate array) or ASIC (application-specific integrated circuit) comprising a set of logic gates.

Should the invention be implanted on a re-programmable computation machine, the corresponding program (i.e. the sequence of instructions) could be stored on a storage medium (such as for example a floppy disk, a CD ROM or a DVD ROM) which may or may not be detachable, this storage medium being readable by a computer or a processor.

In the example described here above, the coaxial speaker comprises three channels (low-mid, high-mid and tweeter), the transducer of each of the low-mid and high-mid channels comprises a ring-shaped membrane and the transducer of the tweeter channel comprises a dome-shaped membrane.

It is clear that many other embodiments of the invention can be envisaged. It is possible especially to provide for a speaker comprising only two channels or more than three channels.

Figure 6:
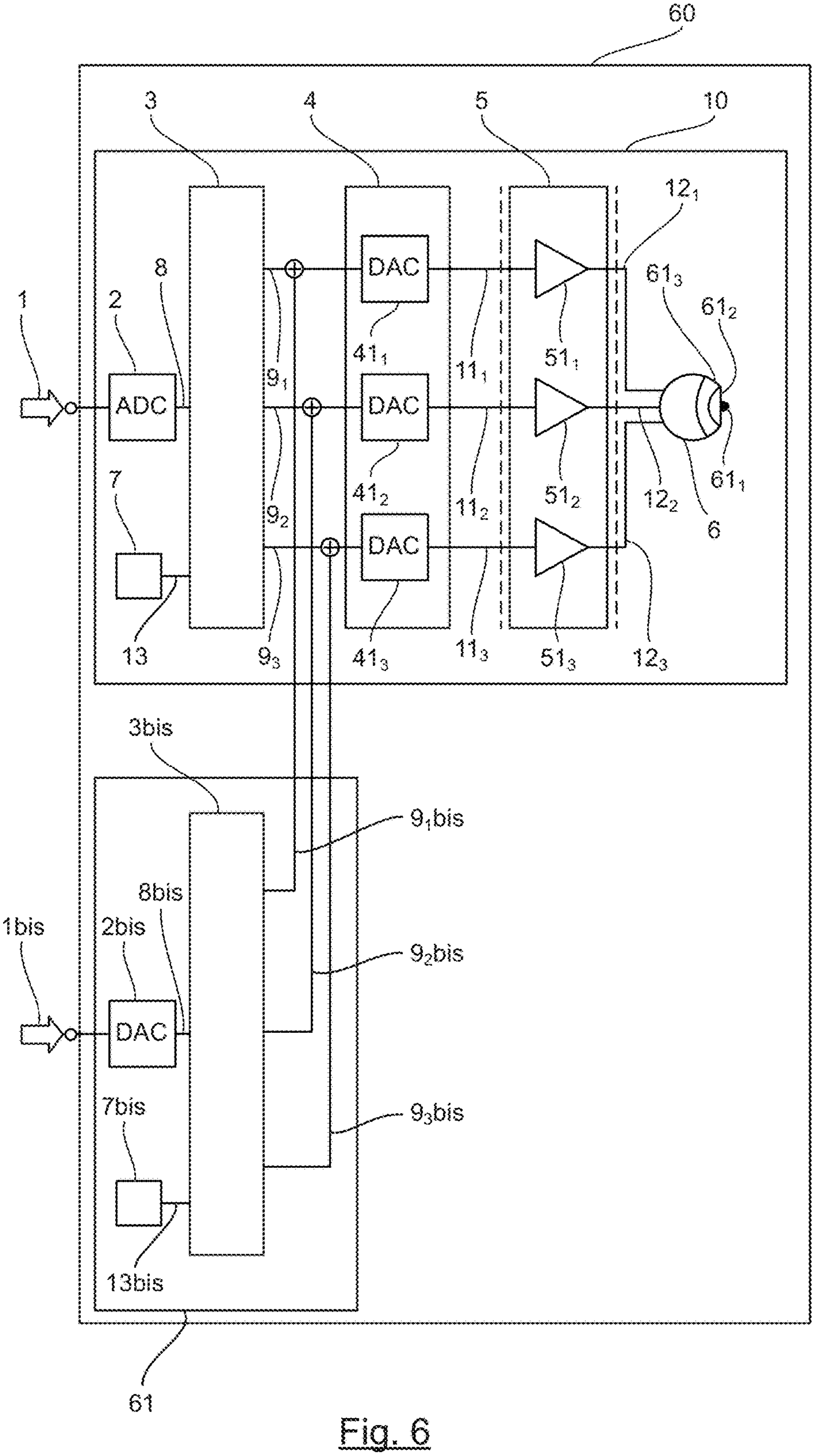

FIG. 6 is a block diagram of an acoustic set 60 according to a second particular embodiment of the invention. This second embodiment can be distinguished from the first one (described here above with reference to FIGS. 1A and 1B) in that it enables the processing of two input signals 1 and 1*a*, each as a function of a distinct directivity control signal 13, 13*a*. More specifically, the acoustic set 60 in this second embodiment comprises a part 61 that is an addition compared with the acoustic set 10 according to the first embodiment.

This additional part 61 comprises:

- a block 7*a* for obtaining a directivity control signal 13*a*. This block 7*a* is identical to the block 7 of FIG. 1A;
- an analog/digital conversion stage comprising an analog/digital converter (ADC) 2*a* which receives a source audio signal 1*a*, should this input signal 1*b* be not digital. This stage 2*a* is identical to the stage 2 of FIG. 1A;
- a filtering stage 3*a* that receives the signal 8*a* output from the analog/digital converter (ADC) 2*a*, as well as the directivity control signal 13*a*. It generates three signals $\mathbf{9}_1$a, $\mathbf{9}_2$a and $\mathbf{9}_3$a, corresponding to the three channels mentioned here above.

Furthermore, the acoustic set 10 is slightly modified in that it comprises three summing means, enabling the adding of the signals generated by the filtering stage 3*a* with those generated by the filtering stage 3*a* as follows: $\mathbf{9}_1$+$\mathbf{9}_1$a, $\mathbf{9}_2$+$\mathbf{9}_2$a and $\mathbf{9}_3$+$\mathbf{9}_3$a.

The digital/analog conversion stage 4 comprises, as in the first embodiment, three digital/analog converters (DAC) $\mathbf{41}_1$, $\mathbf{41}_2$ and $\mathbf{41}_3$, but in the present second embodiment each of these receives one of the signals generated by the summing means.

Thus, by injecting another input signal 1*a* associated with another directivity control signal 13*b* and another filtering stage 3*b* (another set of filters) it is possible to obtain a different directivity for the two input signals 1 and 1*a* at the same instant t.

The principle of this second embodiment can be extended to N input signals. In this case, N−1 additional parts 61 will be used.

Here below, referring to FIGS. 8A, 8B and 8C, two examples are presented of application of acoustic sets with variable directivity according to the invention, in the context of a system of recording and redistribution.

Figure 8A:
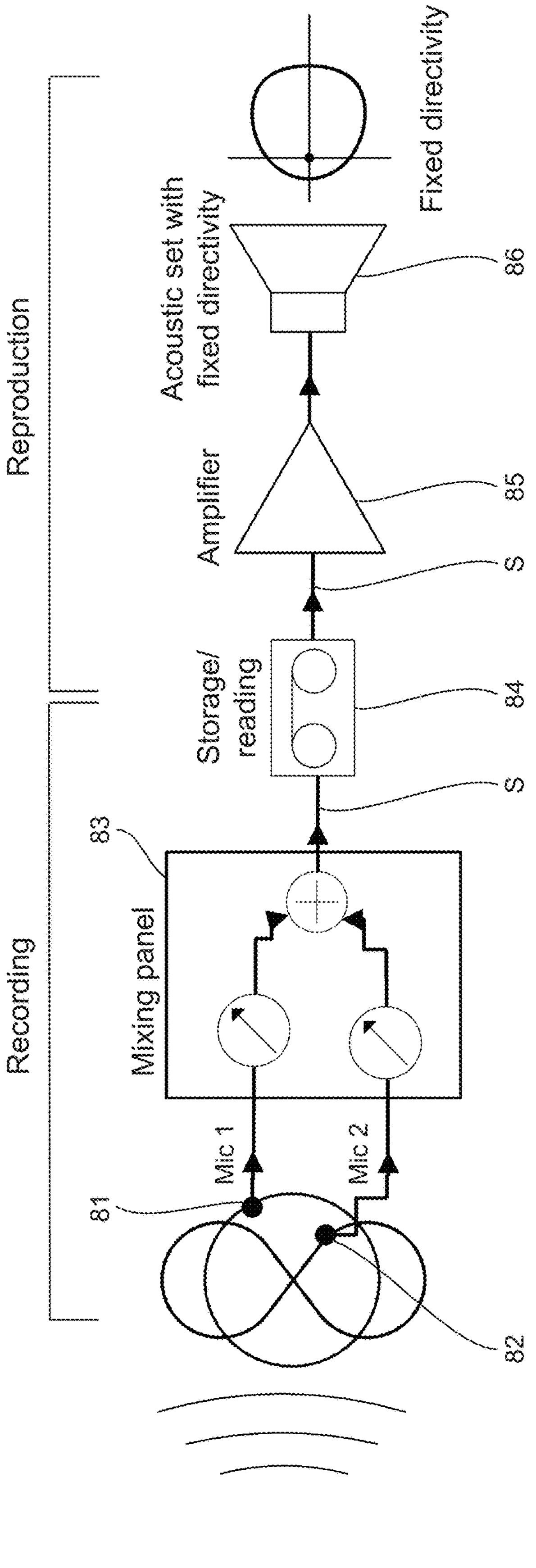
FIG. 8A illustrates a classic implementation of a recording and rediffusion system.

FIG. 8A illustrates a classic implementation of a method of recording and redistribution.

In a recording phase, two microphone capsules 81, 82 possessing different levels of directivity are used simultaneously: one of them 81 to pick up the main sound from an instrument or a voice (this microphone capsule 81 possesses an omnidirectional or cardioid directional pattern), and the other 82 to pick up the ambient sound that does not contain the main sound (this microphone capsule 82 has an figure-of-8 shaped directivity pattern). The signals (referenced Mic1 and Mic2 in FIG. 8A) coming from the two microphone capsules 81, 82 are mixed and added up by means of a mixing panel 83 which gives only one signal S that can be registered in a storage/reading means 84.

In a reproduction phase, the signal S preliminarily recorded is read in the storage/reading means 84 and presented (after amplification by an amplifier 85) to a classic acoustic set 86 (i.e. an acoustic set with fixed directivity, that is permanently fixed at the time of its construction). It is therefore not possible to control the way in which the classic acoustic set 86 radiates the acoustic wave in the reproduction room.

Figure 8B:
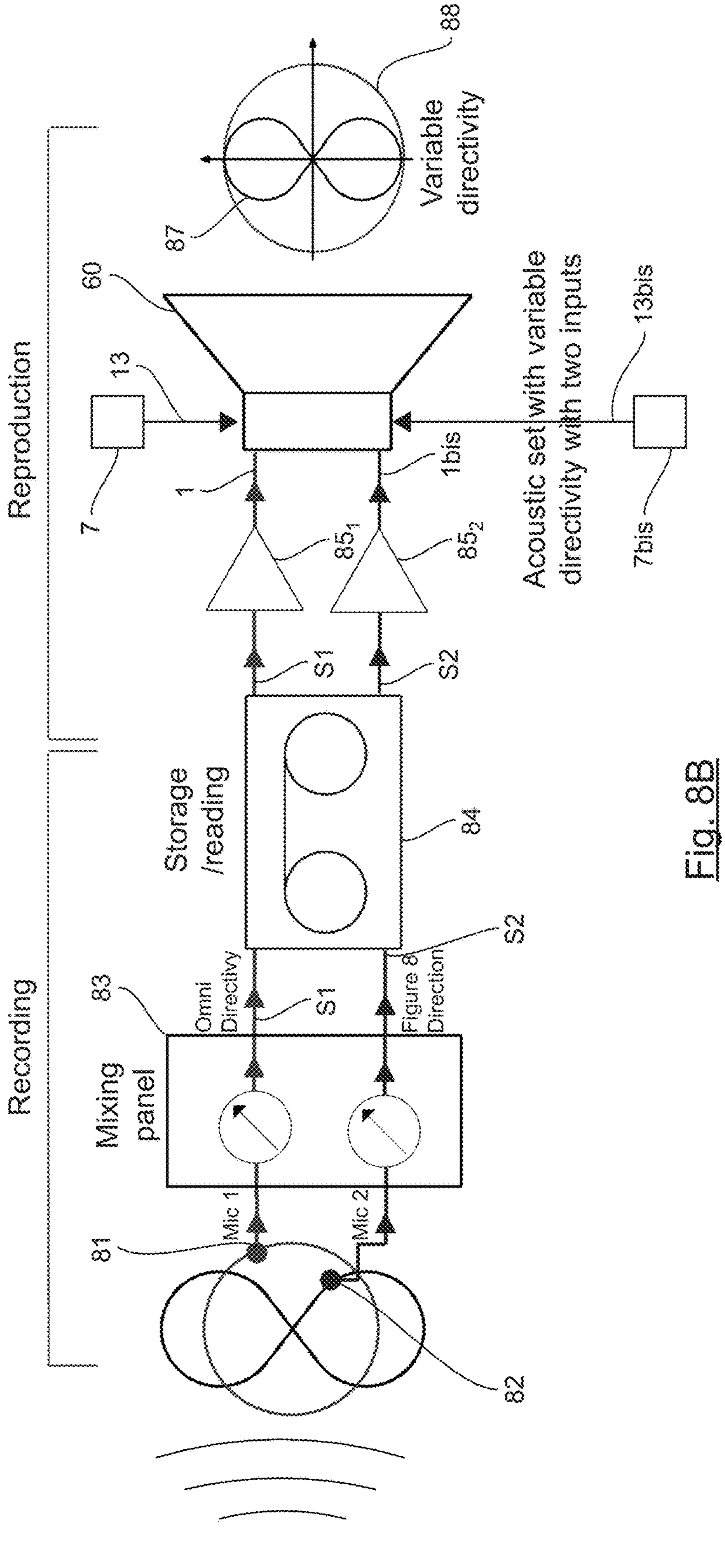
FIG. 8B illustrates an implementation of a recording and redistribution system according to a first particular embodiment of the invention.

FIG. 8B illustrates an implementation of a system for recording and redistribution according to a first particular embodiment of the invention.

In a recording phase, as in the classic technique of FIG. 8A, the two microphone capsules 81, 82 possessing different levels of directivity, are used. However, contrary to the classic technique, the mixing panel 83 does not mix and does not add up the signals Mic1 and Mic2 coming from the two microphone capsules 81, 82. The mixing panel 83 is used in the present case only to modify each of the signals Mic1 and Mic2 (for example adjustment in level and in frequency content, with possible effects: reverberations, delay, etc), the resulting signals being referenced S1 and S2 respectively. The mixing panel 83 therefore gives two signals S1, S2 (and not a single signal S) capable of being recorded in the storage/reading means 84.

In a reproduction phase, the pre-recorded signals S1 and S2 are read in the storage/reading means 84 and presented (after amplification of each by a distinct amplifier $\mathbf{85}_1$, $\mathbf{85}_2$) to the two inputs of a variable-directivity acoustic set 60 according to the invention (for example the one described further above with reference to FIG. 6). The directivity associated with the first input is adjusted with a first directivity control signal 13 given by the block 7. Similarly, the directivity associated with the second input is adjusted with a second directivity control signal 13*a* given by the block 7*b*. As described further above, each block 7, 7*a* comprises for example an adjusting potentiometer enabling the user to easily vary the directivity of the acoustic set for the signal received at the concerned input (first and second input). In one variant, the directivity control signal 13, 13*a* is determined during the mixing and is stored and conveyed at the same time as the source audio signal 1, 1*a* (for example in the form of "metadata") and the block 7, 7*a* comprises appropriate extraction means. Thus, the acoustic set 60, simultaneously and with different and adapted directivities (omnidirectional/cardioid directivity referenced 87 and figure-of-eight shaped directivity referenced 88), renders each of the two input signals 1 and 1*a*. Each of these two directivities corresponds to the utmost to the directivity of the microphone 81 or 82 used during sound pick-up operations. Through the invention, the characteristics of diffusion of the sound wave in the listening room are therefore complied with.

Figure 8C:
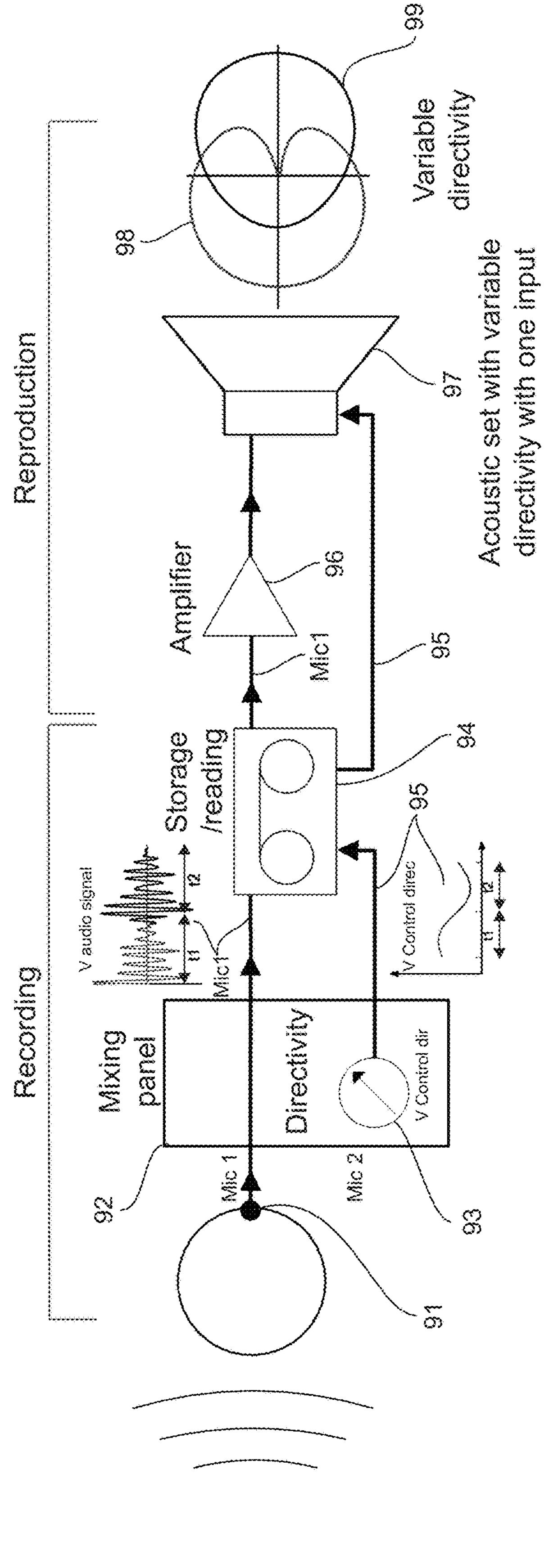
FIG. 8C illustrates an implementation of a recording and redistribution system according to a second particular embodiment of the invention.

FIG. 8C illustrates an implementation of a system of recording and redistribution according to a second particular embodiment of the invention In a recording phase, a monophone signal Mic1 is picked up by a microphone 91 (for example omnidirectional) or is synthesized by a sound generator (synthesizer, sound track, sampler, etc), and then is mixed with a mixing panel 92. This mixing consists for example in creating effects of broadcasting of the sound wave, that are variable depending on the results sought in the listening room. This can be done through a directivity control button 93 which is present for example on the mixing panel 92. In this case, the mixing panel 92 gives two signals to a storage/reading means 94: the signal Mic1 coming from the microphone and a directivity control signal 95. In the example illustrated, an example of a signal Mic1 is presented during two time slots t1 and t2 along with an example of a directivity control signal 95 associated by the same time slots t1 and t2.

In a reproduction phase, the pre-recorded signal Mic1 is read in the storage/reading means 84 and is presented (after amplification by an amplifier 96) to the input of an acoustic set 97 with variable directivity according to the invention (for example identical to the acoustic set 10 described further above with reference to FIG. 1A). This acoustic set 97 also receives the directivity control signal 95 (for example identical to the signal referenced 13 in FIG. 1A) which gives the result sought (rendering of the diffusion effects) in the listening room, by the real-time modification of the acoustic set (dynamically). For example, a directivity referenced 99 is obtained during a first time slot (corresponding to t1 during the recording phase) and then the directivity referenced 98 is obtained in a second time slot (corresponding to t1 during the recording phase). The directivity referenced 98 corresponds to a pattern of directivity illustrated in FIG. 7 and obtained with weighting coefficients +1 and −1.

Here below, with reference to FIGS. 9A, 9B and 10, two examples of application of variable directivity acoustic sets according to the invention are presented in the context of a multichannel audio system.

Figure 9A:
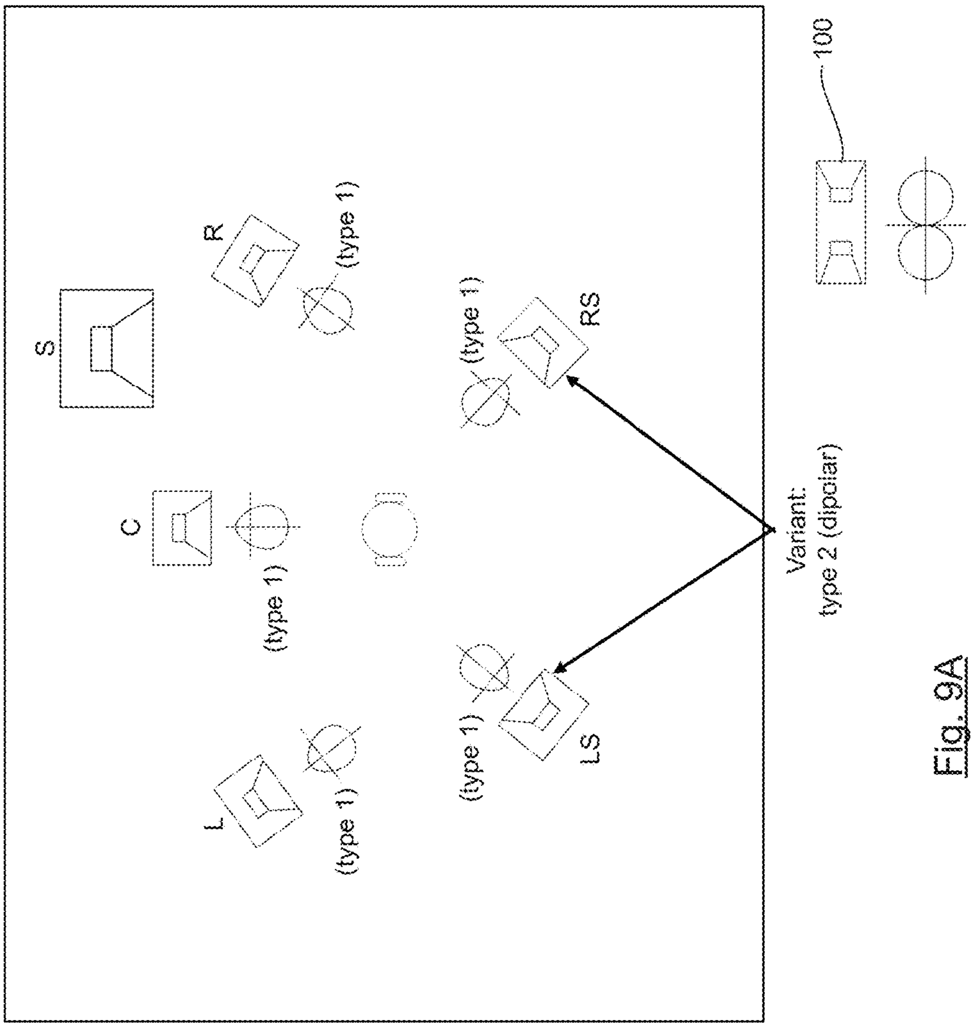
FIG. 9A illustrates a classic implementation of a multichannel audio system in the particular case of a system 5.1.

FIG. 9A illustrates a classic mode of implementation of a multichannel audio system in the particular case of a system 5.1 comprising a left acoustic set (L), a center acoustic set (C), a right acoustic set (R), a left surround acoustic set (LS), a right surround acoustic set (RS), and a subwoofer (S) acoustic set.

Usually, for the front acoustic sets (right R, left L and center C), it is desired to have diffusion that is more directional. For the front acoustic sets R, L and C, therefore, identical acoustic sets of a first type are used. This is illustrated in FIG. 9A by the pattern of directivity (frontally directive pattern) represented near each of the acoustic sets R, L and C and by the "type 1" label attached to each of these acoustic set R, L and C.

By contrast, for the rear (left LS and right RS) it is sought rather to obtain an enveloping effect. Unfortunately, if the same type of acoustic set is used for these rear acoustic sets LS and RS as for the front acoustic sets R, L and C, especially for aesthetic reasons, this enveloping effect cannot be obtained. Indeed, all the acoustic sets then necessarily have the same directivity. This is illustrated in FIG. 9A by the directivity pattern represented near each of the rear acoustic sets LS and RS and by the "type 1" label attached to each of the rear acoustic sets LS and RS.

A known alternative solution consists in the use, for the rear acoustic sets LS and RS, of dipolar acoustic sets 100 which necessarily have different aesthetic features, and are more bulky because they require at least twice the number of speakers per acoustic set. This alternative solution is illustrated at the bottom of FIG. 9A by the eight-shaped directivity pattern (enabling the creation of an enveloping effect) represented close to a dipolar acoustic set (that can be used for each of the rear acoustic sets LS and RS) and by the "type 2" label attached to this dipolar acoustic set 100.

Figure 9B:
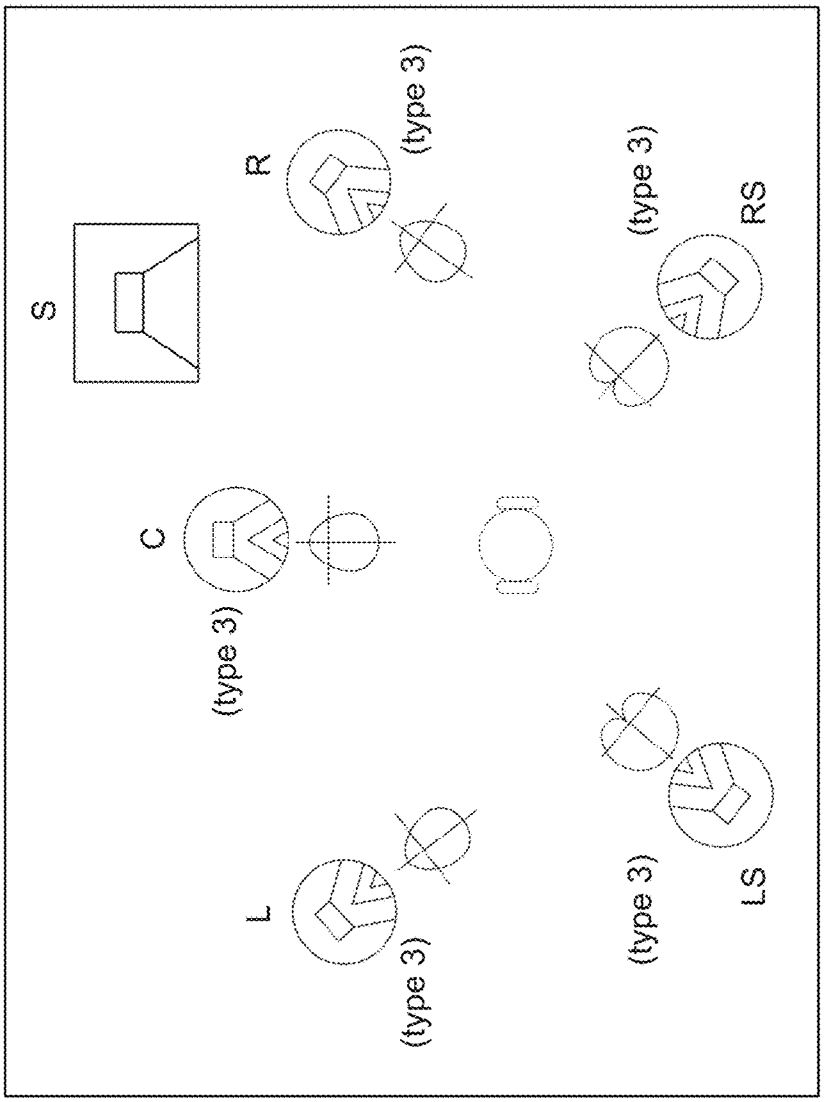
FIG. 9B illustrates an implementation of a multichannel audio system (in the particular case of a system 5.1) according to a first particular embodiment of the invention.

FIG. 9B illustrates an implementation of a multichannel audio system (in the particular case of the system 5.1) according to a first particular embodiment of the invention.

The front acoustic sets R, L and C and the rear 6 acoustic sets LS and RS are identical: they are all acoustic sets with one input and with variable directivity according to the invention (for example identical to the acoustic set 10 described further above with reference to FIG. 1A). This is illustrated in FIG. 9B by the "type 3" label (meaning "type according to the invention") attached to each of these five acoustic sets R, L, C, LS and RS.

Through the invention, the rear acoustic sets LS and RS are identical to the front acoustic sets R, L and C but however have radically different directivities because they receive different directivity control signals. This is illustrated in FIG. 9B by the "frontally directive" type pattern represented close to each of the rear acoustic sets LS and RS and by the "laterally directional" type pattern (enabling the creation of an enveloping effect) represented close to each of the rear acoustic sets LS and RS.

Optionally, the directivity of each acoustic set is optimized relative to the place of listening and the effect sought. This directivity is coupled for example to a room compensation algorithm considering the directivity to be an input that is variable (through the concept of the present invention) and no longer unchanging (as described in the patent document FR2965685).

The directivity of each acoustic set is adjusted for example through a potentiometer (at the height of the acoustic set) or else by means of a directivity control signal sent by the multichannel decoder, given the channel addressed to this acoustic set (right channel, left channel, center channel, left surround channel or right surround channel).

Figure 10:
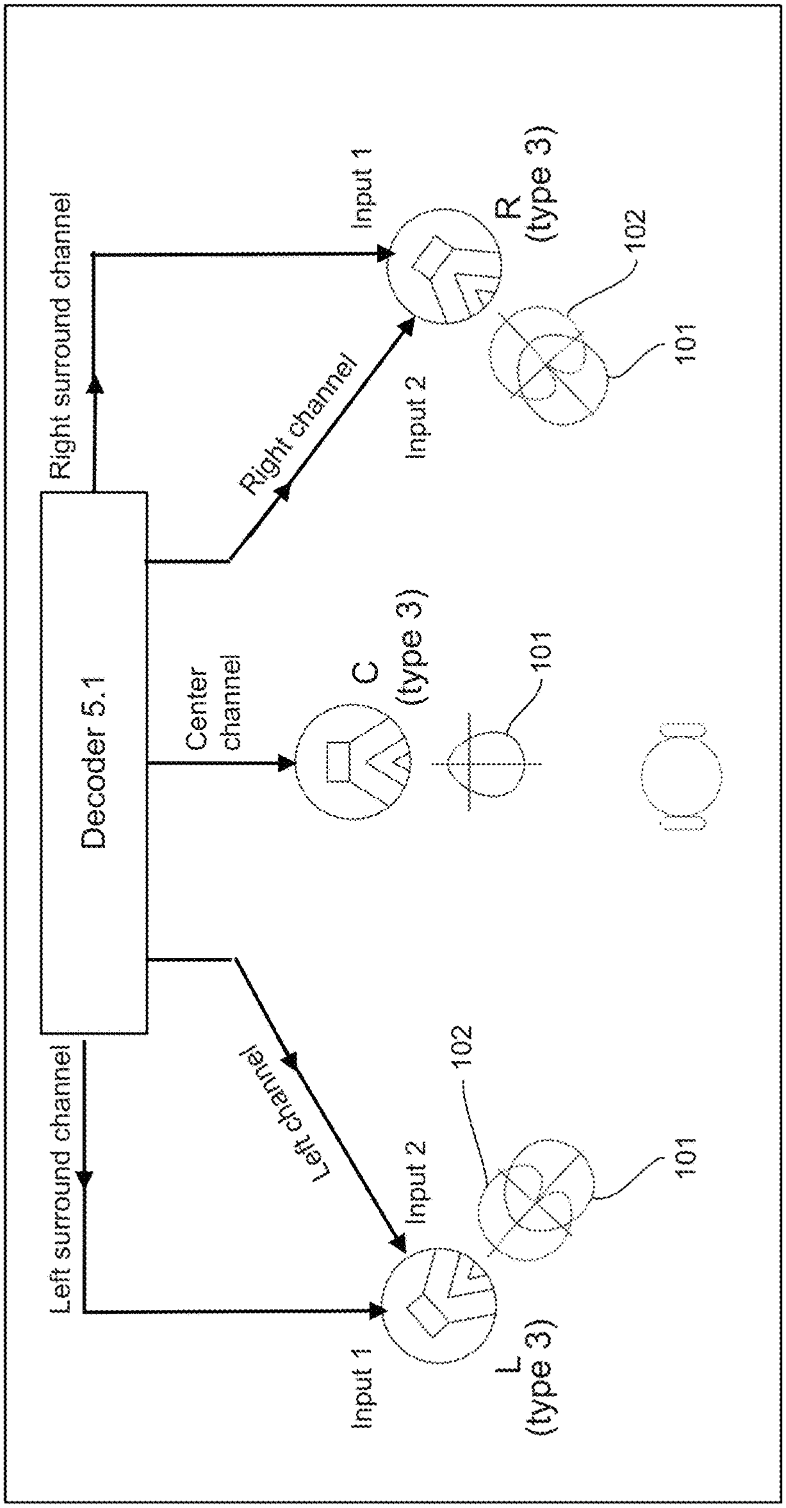
FIG. 10 illustrates an implementation of a multichannel audio system according to a second particular embodiment of the invention.

FIG. 10 illustrates an implementation of a multichannel audio system according to a second particular embodiment of the invention.

This multichannel audio system comprises a decoder 5.1 to which front acoustic sets R, L and C are connected (and a "woofer" acoustic set S, not shown), but no rear acoustic sets LS and RS.

Each of the acoustic sets, namely the left front acoustic set L and right front acoustic set R is a two-input acoustic set with variable directivity according to the invention (for example identical to the acoustic set 60 described further above with reference to FIG. 6). More specifically, the rear left acoustic set LS receives, at an "input 1", the "left surround channel" signal at an "input 2" the "left channel" signal. Similarly, the right rear acoustic set RS receives, at an "input 1", the "right surround channel" signal and at an "input 2" the "right channel" signal. At each input ("input 1" or "input 2") of each rear acoustic set LS or RS there is a distinct directivity control signal associated:

- the signal at the "input 2" (i.e. the "right channel" signal or the "left channel" signal) is associated with a directivity control signal making it possible to obtain a directivity pattern of the "frontally directivity" type (referenced 101 in FIG. 10); and
- the signal at the "input 2" (i.e. the "right surround channel" signal or the "left surround channel" signal) is associated with a directivity control signal that can be used to obtain a directivity pattern of the "laterally directive" type (referenced 102 in FIG. 10), enabling the diffusion of the laterally acoustic energy in order to create an enveloping effect.

The front center acoustic set 6 is an acoustic set with one input and variable directivity according to the invention (for example identical to the acoustic set 10 described further above with reference to FIG. 1A). More specifically, it inputs the "center channel" signal with which there is associated a directivity control signal used to obtain a directivity pattern of the "frontally directivity" type (referenced 101 in FIG. 10).

It is clear that the applications presented here above with systems comprising one or more acoustic sets to one or more inputs and variable directivity according to the invention, are given by way of an illustration and are not exhaustive.

An embodiment provides a technique enabling the control and variation of the directivity of a coaxial multiway acoustic set.

An embodiment provides a technique of this kind that is simple to implement and costs little.

An embodiment provides a technique of this kind requiring, on the part of the user, either a very simple action or no action at all.

Although the present disclosure has been described with reference to one or more examples, workers skilled in the art will recognize that changes may be made in form and detail without departing from the scope of the disclosure and/or the appended claims.

The invention claimed is:

1. An acoustic set comprising:

a speaker comprising at least two membranes, each reproducing a different frequency band; and means for filtering a source audio signal, which generates a plurality of activation signals, each activation signal actuating one of the membranes;

a frequency range of operation with variable and controlled directivity, wherein each frequency of the frequency range of operation belongs to at least two of the frequency bands reproduced by the membranes;

means for obtaining a directivity control signal, wherein for each respective frequency of said frequency range, the means for filtering is configured to apportion a contribution of each of the at least two membranes reproducing the respective frequency according to the directivity control signal by applying:

a first filtering having an amplitude that is weighted as a function of the directivity control signal; and a second filtering having a phase that is also weighted as a function of the directivity control signal.

2. The acoustic set according to claim 1, wherein the speaker comprises at least three membranes, each reproducing a different frequency band and said frequency range of operation is formed by at least two contiguous overlap bands between the frequency bands produced by said at least three membranes.

3. The acoustic set according to claim 1, wherein the means for obtaining the directivity control signal comprise means for setting the value of said directivity control signal by a user.

4. The acoustic set according to claim 1, wherein the means for obtaining the directivity control signal comprise:

means for receiving a data stream containing said source audio signal and said directivity control signal; and means for extracting the directivity control signal contained in the data stream.

5. The acoustic set according to claim 1, wherein the speaker comprises at least three membranes forming at least three adjacent channels belonging to the group consisting of: a woofer, a low-mid channel, a high-mid channel and a tweeter.

6. The acoustic set according to claim 1, further comprising means for equalization, placed upstream to the means for filtering and acting according to the directivity control signal.

7. The acoustic set according to claim 1, wherein the means for filtering are implemented at least partially in the form of a processor executing at least one determined filtering program.

8. The acoustic set according to claim 1, wherein, for said respective frequency of said frequency range, the directivity control signal is proportional to an average directivity index desired for the acoustic set at said respective frequency.

9. The acoustic set according to claim 1, wherein said means for filtering comprise:

at least two blocks each enabling generation, from a distinct source audio signal, of a plurality of activation signals each associated with one of the membranes;

summing means enabling summing of the activation signals generated by said blocks, as a function of the membranes with which they are associated, to obtain resultant signals, each feeding one of said means for actuating one of the membranes;

wherein the acoustic set comprises means for obtaining at least two directivity control signals each associated with one of the source audio signals, and wherein each block makes it possible, for a frequency of said frequency range of operation and as a function of the directivity control signal associated with the source audio signal received by said block, to apportion the contribution of each of said at least two membranes reproducing said frequency, for the reproduction of said source audio signal received by said block, each block being configured to make possible said apportion for each frequency of said frequency range of operation.

10. The acoustic set of claim 9, further comprising means for receiving a signal transporting a data stream containing at least two source audio signals each associated with a distinct directivity control signal, each directivity control signal configured to dynamically control and vary the directivity of an acoustic set, for the reproduction of the source audio signal associated with said directivity control signal.

11. The acoustic set according to claim 1, wherein said speaker is a coaxial speaker comprising coaxial membranes.

12. A method comprising:

receiving a signal transporting a data stream containing a source audio signal and a directivity control signal, said directivity control signal configured to dynamically control and vary directivity of an acoustic set comprising a speaker having at least two membranes each reproducing a different frequency band; and filtering the source audio signal to generate a plurality of activation signals, each activation signal actuating one of the membranes, wherein the acoustic set has a frequency range of operation with variable and controlled directivity, wherein each frequency of the frequency range of operation belongs to at least two of the frequency bands reproduced by the membranes; and for each respective frequency of said frequency range of operation, apportioning a contribution of each of the at least two membranes reproducing said respective frequency according to the directivity control signal by applying:

a first filtering having an amplitude that is weighted as a function of the directivity control signal; and a second filtering having a phase that is also weighted as a function of the directivity control signal.

13. An acoustic set comprising:

a speaker comprising at least three membranes, each reproducing a different frequency band; and means for filtering a source audio signal, which generates a plurality of activation signals, each activation signal actuating one of the membranes;

a frequency range of operation with variable and controlled directivity, wherein each frequency of the frequency range of operation belongs to at least two of the frequency bands reproduced by the membranes, and said frequency range of operation is formed by at least two contiguous overlap bands between the frequency bands produced by said at least three membranes;

means for obtaining a directivity control signal, wherein for each respective frequency of said frequency range, the means for filtering is configured to apportion a contribution of each of the at least three membranes reproducing the respective frequency according to the directivity control signal.

14. An acoustic set comprising:

a coaxial speaker comprising at least two coaxial membranes, each reproducing a different frequency band; and means for filtering a source audio signal, which generates a plurality of activation signals, each activation signal actuating one of the membranes;

a frequency range of operation with variable and controlled directivity, wherein each frequency of the frequency range of operation belongs to at least two of the frequency bands reproduced by the membranes;

means for obtaining a directivity control signal, wherein for each respective frequency of said frequency range, the means for filtering is configured to apportion a contribution of each of the at least two membranes reproducing the respective frequency according to the directivity control signal.

* * * * *